(12) United States Patent
Iliadis

(10) Patent No.: US 6,968,157 B2
(45) Date of Patent: Nov. 22, 2005

(54) SYSTEM AND METHOD FOR PROTECTING DEVICES FROM INTERFERENCE SIGNALS

(75) Inventor: Agisilaos A. Iliadis, Adelphi, MD (US)

(73) Assignee: University of Maryland, College Park, MD (US)

( * ) Notice: Subject to any disclaimer, the term of this patent is extended or adjusted under 35 U.S.C. 154(b) by 477 days.

(21) Appl. No.: 10/224,641

(22) Filed: Aug. 21, 2002

(65) Prior Publication Data

US 2003/0040278 A1   Feb. 27, 2003

Related U.S. Application Data

(60) Provisional application No. 60/314,194, filed on Aug. 22, 2001.

(51) Int. Cl.[7] .......................... H04B 1/00; H04B 15/00; H04B 17/00; H04Q 7/20
(52) U.S. Cl. ............... 455/67.13; 455/63.1; 455/67.11; 455/423; 455/425
(58) Field of Search ........................... 455/63.1, 67.11, 455/67.13, 423, 425

(56) References Cited

U.S. PATENT DOCUMENTS

| | | |
|---|---|---|
| 4,250,408 A | 2/1981 | Spence |
| 5,030,858 A | 7/1991 | Sekiya |
| 5,063,304 A | 11/1991 | Iyengar |
| 5,105,325 A | 4/1992 | Lawrence |
| 5,179,490 A | 1/1993 | Lawrence |
| 5,202,590 A | 4/1993 | Liepold et al. |
| 5,241,697 A | 8/1993 | Hansen |
| 5,287,557 A | 2/1994 | Hansen |
| 5,287,558 A | 2/1994 | Hansen |
| 5,307,379 A | 4/1994 | Bergstrom et al. |
| 5,339,463 A | 8/1994 | Hansen |
| 5,369,470 A | 11/1994 | Hansen |
| 5,424,618 A | 6/1995 | Bertenshaw et al. |
| 5,528,188 A | 6/1996 | Au et al. |
| 5,537,073 A | 7/1996 | Arimoto |
| 5,564,093 A | 10/1996 | Matsumoto |
| 5,714,900 A | 2/1998 | Ehlers |
| 5,739,788 A | 4/1998 | Dybdal et al. |
| 5,760,631 A | 6/1998 | Yu et al. |
| 5,914,844 A | 6/1999 | Lutley et al. |
| 5,942,931 A | 8/1999 | Yanai |
| 5,973,906 A | 10/1999 | Stevenson et al. |
| 5,990,757 A | 11/1999 | Tonomura et al. |
| 6,009,314 A * | 12/1999 | Bjork et al. .................. 455/83 |
| 6,011,420 A | 1/2000 | Watt et al. |
| 6,130,811 A * | 10/2000 | Gans et al. .................. 361/56 |
| 6,169,888 B1 | 1/2001 | Lindenmeier et al. |
| 6,243,247 B1 | 6/2001 | Akdag et al. |
| 6,246,902 B1 | 6/2001 | Naylor et al. |
| 6,259,752 B1 | 7/2001 | Domino et al. |
| 6,282,408 B1 | 8/2001 | Jang |

(Continued)

Primary Examiner—Lee Nguyen
Assistant Examiner—Wen Huang
(74) Attorney, Agent, or Firm—Rosenberg, Klein & Lee

(57) ABSTRACT

An interference protection system for rejecting microwave or radio frequency interference signals is embedded into a sealed packaged chip at any port susceptible to being coupled to an interference signal such as I/O pins or antenna. The interference protection system includes a sense unit for detecting signals with amplitudes exceeding a predetermined threshold level and a protection unit including a pair of MOSFET switches connected in series and maintained in ON state during normal communication state. The switches are switched OFF once the sense unit detects the interference event. A registry unit is included for registering interference events.

15 Claims, 4 Drawing Sheets

U.S. PATENT DOCUMENTS

| | | |
|---|---|---|
| 6,288,885 B1 | 9/2001 | Jiang et al. |
| 6,344,958 B1 | 2/2002 | Morrill |
| 6,360,077 B2 | 3/2002 | Mizoguchi |
| 2001/0046867 A1 | 11/2001 | Mizoguchi |
| 2002/0004377 A1 | 1/2002 | Snygg et al. |
| 2002/0008563 A1 | 1/2002 | Lin |
| 2002/0024113 A1 | 2/2002 | Hurkx et al. |
| 2002/0030471 A1 | 3/2002 | Fayneh et al. |
| 2002/0039428 A1 | 4/2002 | Svajda et al. |
| 2002/0047728 A1 | 4/2002 | Held et al. |
| 2002/0064007 A1 | 5/2002 | Chang et al. |

\* cited by examiner

SYSTEM AND METHOD FOR PROTECTING DEVICES FROM INTERFERENCE SIGNALS This is a Utility Patent Application based upon Provisional Application Ser. #60/314,194 filed Aug. 22, 2001.

FIELD OF THE INVENTION

The present invention relates to protection of circuits from interference, and more particularly, to protection of field packaged chips from intentional or unintentional microwave or radio frequency interference which may be coupled through I/O pins or antennae in sealed packaged chips.

More in particular, the present invention relates to an on-chip interference protection system which is embedded into a device to be protected at the device's signal entrance port (or ports) which is susceptible to receiving interference signals and senses the interference signal received as well as decoupling of the sensed interference signal from an input of the device under protection.

Further, the present invention relates to an interference protection system embedded into the device to be protected at any interference signal entrance port thereof (which may be either input or output of the device). This includes a sense unit, a protection unit coupled to the sense unit, and optionally, a registry for registering any interference events. In this manner, the sense unit, upon detection of a signal exceeding a predetermined threshold corresponding to an interference signal level, issues an output signal coupled to the protection unit in which a comparator is triggered by such the output signal and switches "off" a MOSFET switch for terminating propagation of the interference signal to the device under protection.

The present invention additionally relates to a method for protecting a device from an interference signal which includes the steps of: embedding an interference protection system into the device at one or each interference signal entrance port, predetermining a threshold voltage defining a level of an interference signal, sensing a level of signal received at the interference signal entrance port, and terminating propagation of the received signal to the input of the device under protection if the level of the received signal exceeds the predetermined threshold voltage.

BACKGROUND OF THE INVENTION

Intentional or unintentional microwave or radio frequency (RF) interference may be coupled through I/O pins or antennae in sealed packaged chips. This interference may affect the operating point, the gain, input and output impedances of devices and various circuit elements. The result of microwave or RF interference depends on the received signal strength and characteristics, for example, pulse width/height, and may range from temporary performance modifications to permanent damage of the effected device. Effects of the microwave or RF interference onto the devices and circuit elements are difficult to monitor and predict, and therefore, protection of the devices and circuits from unwanted interferences is a long-standing problem which needs to be resolved.

Various developments have been made for prevention from interference in receiving signals. For example, U.S. Pat. No. 6,169,888 is directed to a receiving antenna scanning diversity system with controllable switching in which provision is made to eliminate interference in receiving signals. In this device, the interference detector is located within the receiver to generate and to transmit an indication signal, or a signal derived therefrom. Such signal may be converted into a switching signal that affects the switching condition in the antenna installation having the controllable switching circuit.

There are known on-chip interference protection devices for integrated circuits and other electronic components and equipment. For example, the Patent Application Publication 2002/0047728 is directed to an integrated circuit having integrated within it an RF filter device which can prevent or restrict the propagation of high frequency interference signals through lines carrying DC voltages or low frequency voltages required for the operation of the integrated circuit.

In U.S. Patent Application Publication 2002/0030471, an on-chip filter regulator acts as a voltage regulator and a low pass filter. The voltage regulator generates a constant DC output voltage and relays the DC voltage against instantaneous load changes. The low pass filter actively filters the interference out of the DC output voltage.

U.S. Pat. No. 6,243,247 is directed to a strip line transient protection device for protection from radio frequency and microwave frequency interference. The transient protection device has three ports: surge port, a protected port, and a ground port. The surge port receives and/or transmits transmission signals from and to transmission lines and receives a surge or electrical energy from transmission line. The ground port dissipates or discharges the surge or electrical energy to a system ground. The protected port receives and/or transmits transmission signals from and to the circuit board. The transient protection device is the first component in the circuit board that the surge reaches. The surge does not reach the protected port since the transient protection device acts as a capacitor to attenuate or block the surge.

U.S. Pat. Nos. 5,241,697; 5,339,463; and 5,369,470 are all directed to receivers which have circuitry for changing the signal transmission characteristics in response to receiving an interference signal. The protection circuitry includes a detector module with detector circuits for detecting value characteristics of receiving or interference states. The circuitry for changing the signal transmission characteristics also includes an evaluation circuit having at least one amplitude and/or time threshold circuit connected with its detector module and further includes a logic unit which provides processed signals characteristic of received and interference states as control signals. One of the detector circuits in the detector module determines if the signal exceeds a predetermined value, and if such determination is made, the signal characteristics are changed.

Despite a number of developments made by engineers and scientists in the art of protection from microwave and radio frequency interference, the present interference protection system and a method for protecting a device from an interference signal is a further development advance where the specific combination of elements have not been previously attained.

SUMMARY OF THE INVENTION

An object of the present invention to provide a "sense and protect" circuit embedded into a sealed packaged chip which prevents the chip under protection from any configuration of the unwanted radio frequency or microwave signals. This is applicable in wireless communication systems, computer networks, power equipment, radio systems, etc., where the "sense and protect" circuit may be adjusted to react to interference signals of various parameters and characteristics in order to protect a wide range of devices.

It is another object of the present invention to provide an interference protection system for a device, where the interference protection system is embedded into the device at one or each interference signal entrance port thereof and includes first and second interference signal sensing elements coupled by input thereof to the interference signal entrance port. Additionally, a mechanism for pre-setting a threshold voltage defining a level of an interference signal is provided at the interference signal entrance port. Additionally, n- and p-MOSFET switches connected in series each to the other are further provided with each coupled to a respective one of the first and second sensing elements and maintained, in the absence of the interference signals, in the "ON" state, and switched "OFF" in response to sensing the interference signal, for decoupling the device under the protection from the interference signal.

A further object of the present invention to provide a method for interference protection applicable to a wide range of systems and devices being flexible with regard to characteristics of interference signals, by embedding the interference protection system at entrance ports susceptible for interference signal entrance, pre-setting a threshold voltage defining a level of an interference signal for the particular application, receiving a signal at the interference signal entrance port, sensing the level of the received signal, and cutting off supply of the received signal to an input of the device if the level of the receiving signal exceeds a threshold voltage. Such a method of interference protection is based on MOSFET technology, wherein a pair of MOSFET switches coupled in series are maintained in "ON" state during absence of the interference event and are switched "OFF" once such an interference event has been detected.

According to the teachings of the invention, the interference protection system of the present invention comprises a sense element and a protection circuit coupled to the sense element. Additionally, a registry unit may be coupled to the sense element for registering the interference events. The interference protection system is embedded into the device under protection at interference signal entrance ports of the device. The interference signal entrance port can be positioned at the input or output of the device or at any entrance of the device susceptible to receiving the interference signal.

The sense unit includes a first and a second interference signal sensing element coupled by its inputs to the interference signal entrance port. By applying a threshold voltage to the interference signal entrance port, a level of interference signal is defined by the interference protection system. The threshold may be altered in order to adjust the interference protection system to a wide variety of different devices and systems where the characteristics and parameters of interference signals vary from application to application. In this manner, the present invention provides for universal interference protection system applicable to a wide range of different systems and applications capable of protecting the circuits and elements from interference of various parameters, characteristics, and nature.

The protection unit of the interference protection system of the present invention includes first and second MOSFET switches, which are P-MOSFET and N-MOSFET connected in series each to the other with each operatively coupled to a respective one of the first and second sensing elements of the sense unit through respective comparators. The comparators maintain the P-MOSFET and N-MOSFET in their "ON" state during the absence of the interference event. However, when the sensing element detects that the received signal exceeds the threshold voltage, thus "sensing" an interference event, the sensing element issues an interference indication output signal which triggers a respective comparator, which in its turn, generates at the output thereof a control signal coupled to a gate of a respective P- or N-MOSFET, so that the respective P- or N-MOSFET switch is switched "OFF", thereby ceasing the further propagation of the interference signal by decoupling the device under protection from the interference signal.

Preferably, the N-MOSFET switch is coupled by the source thereof to the interference signal entrance port, and the P-MOSFET switch is coupled by the drain thereof to the device under protection at the input thereof.

A first low pass filter is coupled between the output of the first sensing element and the input of the first comparator, while a second low pass filter is coupled between the output of the second sensing element and the input of the second comparator.

Preferably, the first and second sensing elements of the sense unit include an odd number of CMOS inverters with the inputs thereof coupled to the interference signal entrance port. Each of the comparators preferably includes at least two CMOS inverters coupled in parallel to each other.

Viewing another aspect of the invention, the present invention provides a method for protecting a device from an interference signal, including the steps of:
  embedding into the device an interference protection system at at least one interference signal entrance port,
  pre-setting a threshold voltage defining a level of an interference signal for the particular application (the threshold voltage is applied to the interference signal entrance port of the device),
  sensing the level of the received signal, and
  cutting off supply of the received signal to the input of the device under protection if the level of the receiving signal exceeds the threshold voltage predetermined for the particular application of the device.

The method further includes the steps of:
  issuing an interference indicative output signal in the case of the sensed interference event, and switching "OFF" one of two MOSFET switches (depending on the polarity of the interference signal) in response to such interference indicative output signal in order to terminate the propagation of the interference signal.

These and other objects and features of the present invention will become apparent from the following detailed description of the present invention considered in connection with the accompanying Drawings which disclose an embodiment of the present invention. It should be understood, however, that the Drawings as well as the Description are presented here for the purpose of illustration only and not as a definition of the limits of the invention.

BRIEF DESCRIPTION OF THE DRAWINGS

In the Drawings, wherein similar reference characters denote similar elements throughout the several views.

DETAILED DESCRIPTION OF THE PRESENT INVENTION

Figure 1:
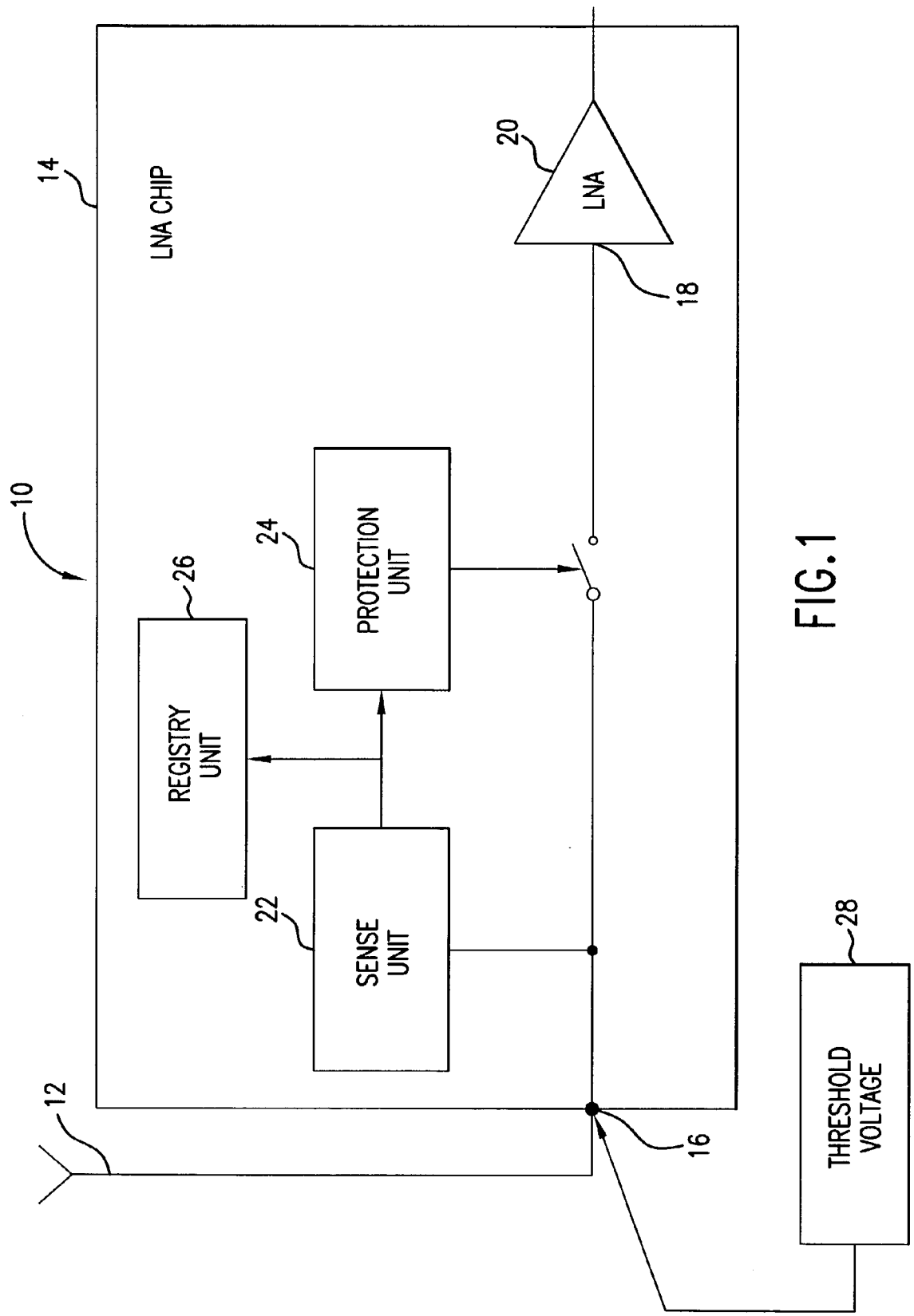
FIG. 1 is a schematic representation of the basic principle of the present invention.
Figure 2:
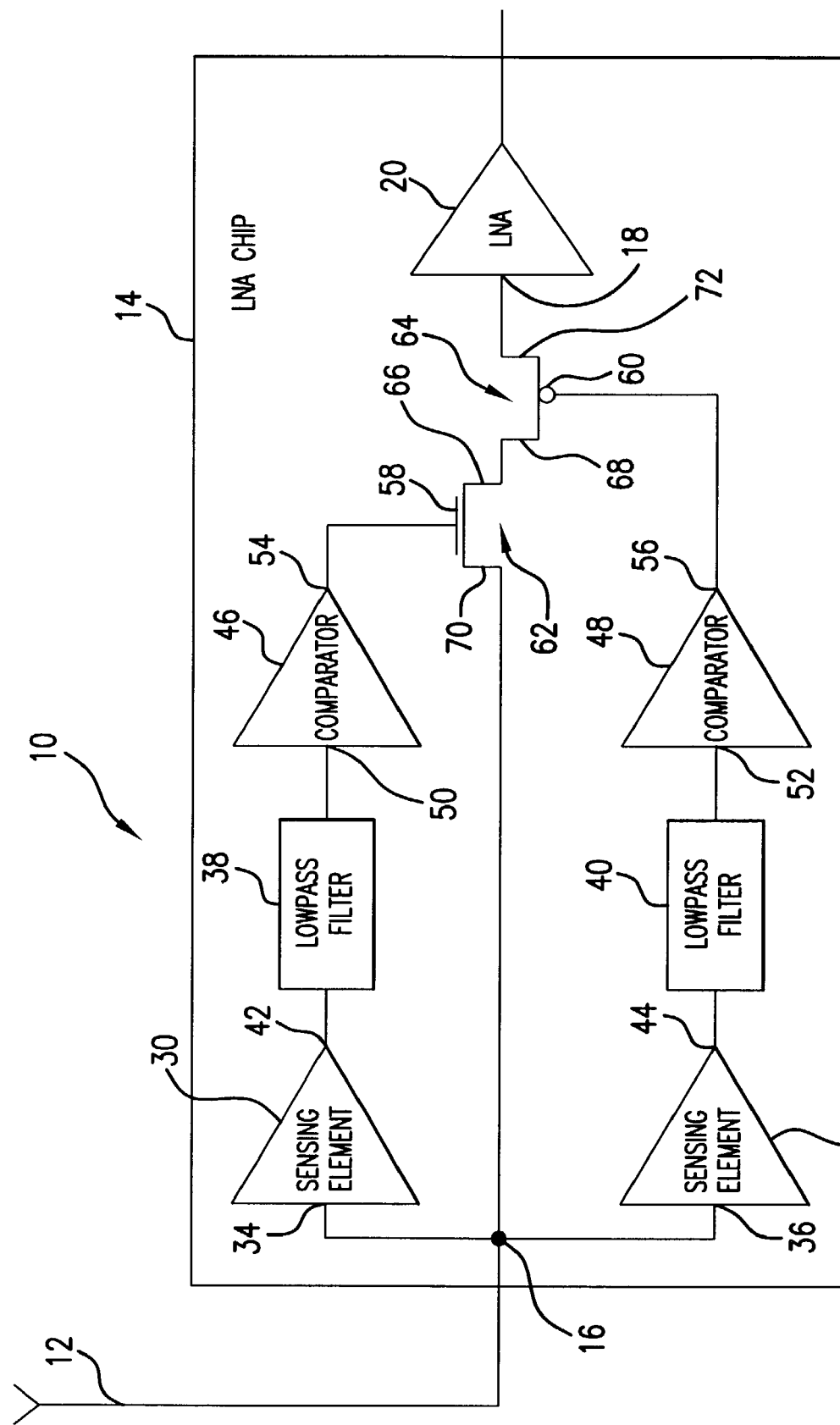
FIG. 2 is a block diagram of the elements of the interference protection system of the present invention.
Figure 3:
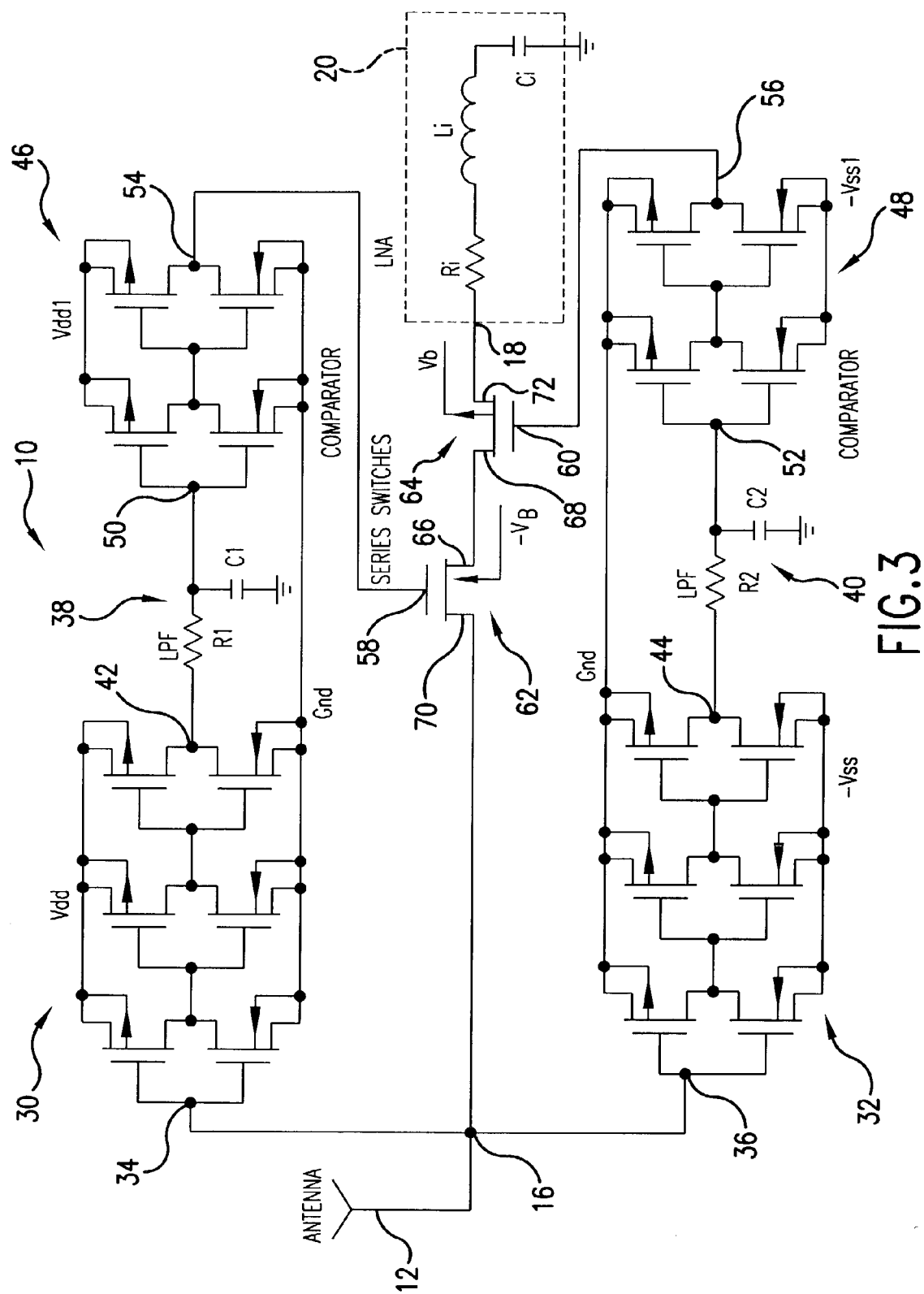
FIG. 3 is a detailed circuit representation of the interference protection system of the present invention.

The interference protection system 10 shown in FIGS. 1–3 is applicable to a wide range of devices and systems, including, but not limited to wireless communication systems, computer networks, power equipment, radar systems, etc. The system of the present invention may be adapted to respond to the appropriate frequency, power, amplitude and duration of the incoming signal for any of the plurality of systems, devices, and circuits known in the art. However, for the purpose of simplicity of the current description, and not to limit the scope of protection of the present invention, the further description of the principles and details of the interference protection system is given with respect to a low noise amplifier, also referred to herein as LNA, receiving signals from the antenna 12 in a wireless communication system.

Thus, as shown in FIGS. 1–2, the interference protection system 10 is embedded into a low noise amplifier chip 14 between an interference signal entrance port 16 and the input 18 of the low noise amplifier 20.

The interference protection system 10 includes a sense unit 22, a protection unit 24, and optionally, a registry unit 26 for registering the sensed interference events.

The registry unit 26 may be an "off-the-shelf" item, and may, for example, include a buffer using two inverters with the input coupled to the output of the sense unit 22. A signal from the buffer would be fed into a connector circuit composed of three D flip-flops, described in J. Millman, et al., "Micro-Electronics", McGraw-Hill, New York, Second Edition, pp. 330–338. Each D flip-flop output represents the binary digital output.

For different applications, since the characteristics and parameters of the interference signal may differ, the level of interference signals must be determined for each particular device. In the system of the present invention, this is accomplished by applying a threshold voltage 28 to the interference signal entrance port 16, as shown in FIG. 1. The threshold voltage defines a level of the signal, which the interference protection system 10 considers as the interference signal. In the particular application for a low noise amplifier in the receiver of wireless communication system, the threshold voltage defining a signal recognizable as an interference signal is larger in amplitude than a few hundred mV and with a frequency greater than 100 KHz. The "sense and protect" circuit of the present invention is adjustable for any configuration of signals depending on the application. Signals of smaller amplitude are considered legitimate signals or noise signals which again depends on the application. For example, in a wireless communication system, the legitimate signals may be a few hundred mV of amplitude, thus they may be distinguished from the unwanted intentional or unintentional RF interference. For other types of systems, i.e., computer networks, power equipment, radar systems, etc., the "sense and protect" circuit may be adjusted accordingly.

Turning to the block diagram of the interference protection system 10 of the present invention, shown in FIG. 2 on a more detailed scale than that shown in FIG. 1, the interference protection system 10 is coupled at the RF interference signal entrance port 16 between the antenna 12 and the input 18 of the low noise amplifier (LNA) 20 on the LNA chip 14. The interference protection system 10 includes a first sensing element 30 and a second sensing element 32 coupled by inputs 34 and 36 to the interference signal entrance port 16.

First and second low pass filters 38 and 40 are coupled to the outputs 42 and 44 of the first and second sensing elements 30 and 32, respectively. A first comparator 46 and second comparator 48 are coupled by inputs thereof 50, 52, respectively, to the first and second low pass filters 38 and 40. While the outputs 54 and 56 of the comparators 46 and 48, respectively, are connected to the gates 58 and 60 of N-MOSFET switch 62 and P-MOSFET switch 64. The N-MOSFET 62 and P-MOSFET 64 are coupled to each other in series by the drain 66 of the N-MOSFET 62 and the source 68 of the P-MOSFET 64. The source 70 of the N-MOSFET 62 is connected to the interference signal entry port 16, while the drain 72 of the P-MOSFET 64 is directly connected to the input 18 of the device under protection, which in this case is low noise amplifier 20.

In operation, the antenna 12 receives an intended legitimate communication signal, possibly in combination with the illegitimate signals which may alter the operational point of the LNA 20 or even permanently damage the circuit. The legitimate signals are usually a few mV (for example, smaller than 200 mV), while the illegitimate signals are significantly higher which may "upset" and "damage" the chip 14. As such, a lower cut off limit is adjusted for the interference protection system 10 of the present invention by means of application of the threshold voltage 28 to the interference signal entry port 16. In the particular example of the low noise amplifier 20, such a threshold voltage is set for 500 mV. Thus, the interference protection system sensing any signal with an amplitude larger than the 500 mV threshold will cut off that signal from passing to the LNA 20 on the LNA chip 14.

Upon receipt of a signal at or above the level of the predetermined threshold voltage, the sensing elements 30 and 32 will react to these signals by generating at the outputs 42 and 42, respectively, an interference indicative output signal which passes through the respective low pass filter 38 or 40 (in which the issued interference indicative output signal is modified in accordance with the parameters of the LPF 38 and 40) and is applied to the inputs 50 and 52 of the comparators 46 and 48, thus triggering the comparators 46 and 48 to generate respective control signals applied to the gates 58 and 60 of the N-MOSFET 62 or P-MOSFET 64 (depending on polarity of the interference signal pulses received at the interference signal entrance port 16).

Normally, in the absence of the interference signal, the comparators 46 and 48 maintain the N-MOSFET 62 and P-MOSFET 64 in "ON" state in the triode region, and switch the respective N- or P-MOSFETs 62 or 64 off once an interference signal has been sensed as the interference signal entrance port 16, thus decoupling the interference signal from the input 18 of the low noise amplifier 20 and terminating the propagation of the interference signal to the LNA 20.

Referring to FIG. 3, showing a detailed circuit diagram of the elements of the interference protection system 10 of the present invention, the sensing elements 30 and 32 each include an odd number of CMOS inverters having their inputs coupled to the interference signal entrance port 16. Under normal communication operation, i.e., in the absence of the interference event, the voltage at the interference signal entrance port 16 is typically a few hundred $\mu V$.

Under these circumstances, the sensing element 30 outputs a voltage $V_{dd}$ at the output 42 thereof, while the sensing element 32 outputs at the output 44 a voltage $-V_{ss}$. The low pass filters 38 and 40 pass these voltages $V_{dd}$ and $-V_{ss}$ to the inputs 50 and 52 of the comparators 46 and 48.

Each comparator 46, 48 includes two CMOS inverters. Under normal communication operation, the comparator 46 outputs the voltage $V_{dd}$ to the gate 58 of the N-MOSFET 62, while the comparator 48 outputs voltage $-V_{ss}$ to the gate 60 of the P-MOSFET 64, thus keeping the N- and P-MOSFETs 62 and 64 in the "ON" state in the triode region of operation, where the MOSFETs act as linear resistors with a low resistance value.

When however an interference RF pulse is received by the antenna 12 with an amplitude larger than the preset threshold voltage 28 at the interference signal entrance port 16, the sensing elements 30 and 32 detect such an RF interference signal and react to such a receipt of the interference RF signal by changing the output voltage thereof. These outputs which are different from the $V_{dd}$ and $-V_{ss}$, pass through the low pass filters 38 and 40 and are applied to the comparators 46 and 48, thus changing the output signal of the comparators 46 and 48. In this event, the signal indicative of the occurrence of the interference event, output by the comparators 46 and 48, being applied to the gates 58 and 60 of the N-MOSFET 62 or P-MOSFET 64 (depending on the polarity of the signal received at the interference signal entrance port 16), will change the status of the respective N- or P-MOSFET 62 or 64, thus switching the respective MOSFET off and decoupling the interference signal from the input 18 of the low noise amplifier 20. In this manner, the interference signal received by the antenna 12 is not permitted to propagate at the chip 14.

In the method of the present invention, both P- and N-MOSFET switches are maintained in the "ON" state during the absence of interference event. Upon sensing the interference event and switching the MOSFET switches off, the "ON" state of the MOSFET switches is recovered.

Figure 4:
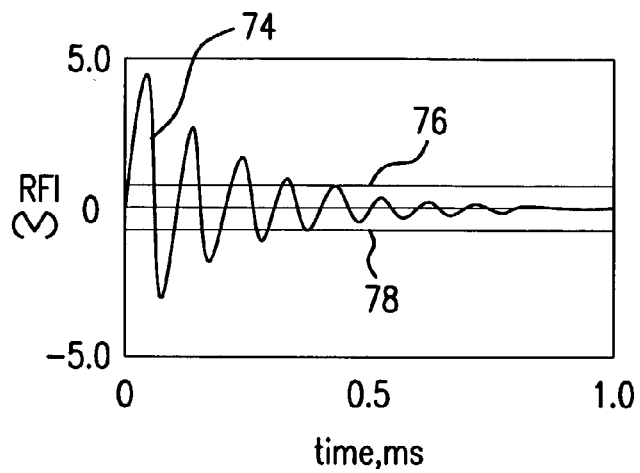
FIG. 4 is a diagram of RFI sinusoidal pulse with pulse amplitude of 5V to −5V used as an input to the interference protection system of the present invention to simulate the effects and operation of the system; and, FIGS. 5A and 5B, respectively, are the diagrams of the input voltage and input current to the device under protection, for example, low noise amplifier, after activation of the interference protection system due to RF interference event.

Shown in FIG. 4, is a diagram of the RF interference pulse in the form of a decaying sinusoid applied to the interference signal entrance port 16 of the interference protection system 10. This pulse 74 is used as an input to the interference protection system 10 to simulate the effects and operation of the system 10. The lines 76 and 78 indicate the threshold level for the interference protection system 10. Any signal received at the interference signal entrance port 16 with the amplitude beyond the threshold voltage, shown as lines 76 and 78, are considered by the interference protection system 10 as the RF interference signal. Upon sensing the signal exceeding the threshold level indicated by the lines 76 and 78, the comparators of the interference protection system 10 switch the respective N- or P-MOSFET to the "OFF" state, thus rejecting the interference signal. In this manner, as long as the signal at the interference signal entrance port 16 exceeds the threshold, illustrated as the lines 76 and 78, it will be cut off from the application to the LNA 20.

Figure 5A:
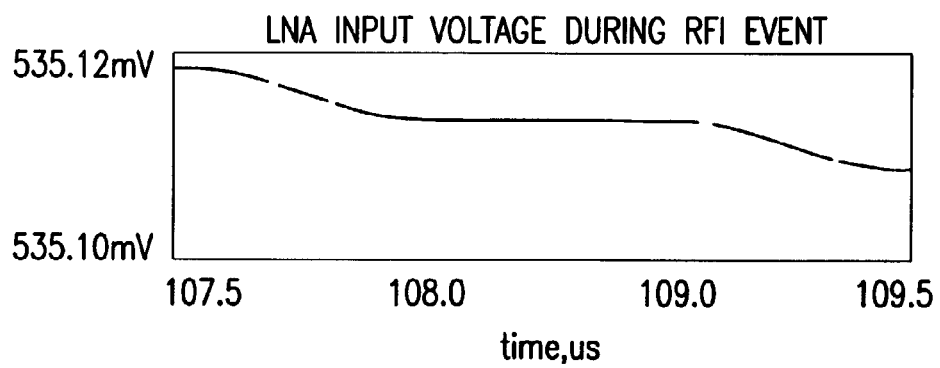
Figure 5B:
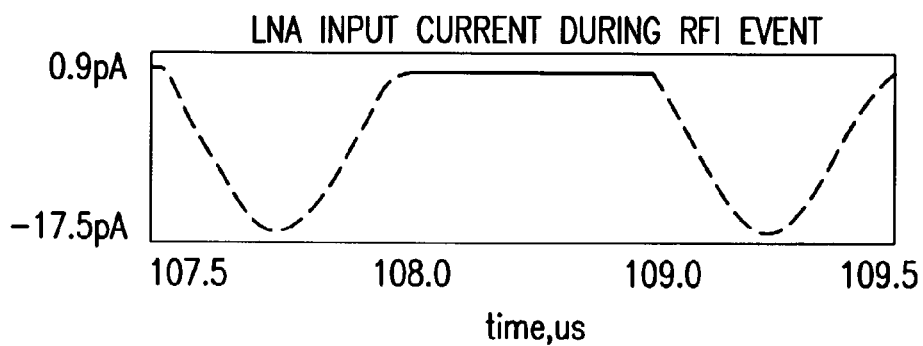

FIGS. 5A and 5B are diagrams showing respectively, input voltage and input current at the input 18 of the low noise amplifier 20 in the event of the detected RF interference signal upon activation of the interference protection system 10 of the present invention. A large RF interference signal (−5V −5V) resulted in just a small ripple in the input voltage (0.01 mV) and input current (17 pA) of the low noise amplifier 20, which is over one order of magnitude lower than the legitimate communication signal received by the antenna 12.

The interference protection system 10 of the present invention may be adapted for use in all RF interference susceptible ports of the chip 14. The interference protection system 10 also is designed to generate control signals to register RF interference events in the register unit 26, best shown in FIG. 1. The interference protection system 10 of the present invention is designed in a manner which allows for fast disconnect and fast reconnect capability upon RF interference event termination. It provides for efficient disconnect capability with minimal coupling in the "OFF" state of the MOSFET switches. The interference protection system 10 is capable of being applicable to a wide frequency range and amplitude range of RF interference events, with minimal LNA redesign to accommodate "sense and protect" circuit of the present invention.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended claims.

What is claimed is:

1. Interference protection system for a device having at least one interference signal entrance port, the interference protection system comprising:

a sense unit, a protection unit coupled to said sense unit, said sense unit and protection unit being embedded into said device at said at least one interference signal entrance port, said sense unit including:

a first and a second interference signal sensing element coupled by inputs thereof to said at least one interference signal entrance port, and said protection unit including:

a first and a second MOSFET switch connected in series each to the other, and each operatively coupled to a respective one of said first and second sensing elements, said respective sensing element issuing an interference indicative output signal in response to detecting a receipt of an interference signal at said at least one interference signal entrance port, a respective one of said first and second MOSFET switches being switched off in response to said interference indicative output signal, thereby decoupling said device from the interference signal; and means for applying a threshold voltage to said at least one interference signal entrance port, said threshold voltage defining a level of an interference signal;

wherein said protection unit further comprises a first and a second comparator, each of said comparators being operatively coupled by an input thereof to an output of a respective one of said first and second sensing elements, and each of said comparators being further coupled by an output thereof to a gate of a respective one of said first and second MOSFET switches.

2. The interference protection system of claim 1, wherein said first and second MOSFET switches include an N-MOSFET and a P-MOSFET switches, respectively, each said MOSFET including a source and a drain, said N-MOSFET switch being coupled by said source thereof to said at least one interference signal entrance port, and said P-MOSFET switch being coupled by said drain thereof to said device at an input thereof.

3. The interference protection system of claim 1, further including a first and a second low-pass filter, each coupled between a respective one of said first and second sensing elements and a respective one of said first and second comparators.

4. The interference protection system of claim 1, wherein said interference indicative output signal is generated once said respective sensing element detects a receipt of a signal exceeding said threshold voltage.

5. The interference protection system of claim 1, wherein said issued interference indicative output signal being applied to said input of a respective one of said first and second comparators, triggers a respective one of said comparators to issue a control signal at the output thereof, said control signal switching "OFF" said respective one of said first and second MOSFET switches.

6. The interference protection system of claim 1, wherein in the absence of an interference event, said first and second MOSFET switches are maintained by said first and second comparators in "ON" state and in a triode region thereof.

7. The interference protection system of claim 1, wherein each of said first and second comparators includes at least two CMOS inverters.

8. The interference protection system for a device having at least one interference signal entrance port, the interference protection system comprising:
a sense unit,
a protection unit coupled to said sense unit, said sense unit and protection unit being embedded into said device at said at least one interference signal entrance port,
said sense unit including:
a first and a second interference signal sensing element coupled by inputs thereof to said at least one interference signal entrance port, and
said protection unit including:
a first and a second MOSFET switch connected in series each to the other, and each operatively coupled to a respective one of said first and second sensing elements, said respective sensing element issuing an interference indicative output signal in response to detecting a receipt of an interference signal at said at least one interference signal entrance port, a respective one of said first and second MOSFET switches being switched off in response to said interference indicative output signal, thereby decoupling said device from the interference signal;
means for applying a threshold voltage to said at least one interference signal entrance port, said threshold voltage defining a level of an interference signal; and
a registry unit coupled to said sense unit for registering interference events.

9. The interference protection system of claim 8, wherein each of said first and second sensing elements includes an odd number of CMOS inverters with the inputs thereof coupled to said at least one interference signal entry port.

10. The interference protection system of claim 8, wherein said at least one interference signal entry port is located at an input of said device.

11. The interference protection system of claim 8, wherein said at least one interference signal entry port is located at an output of said device.

12. The interference protection system of claim 8, wherein said device is a low noise amplifier receiving an information signal from an antenna in a wireless communication system, said interference protection system being embedded between said antenna and said low noise amplifier.

13. The interference protection system of claim 8, wherein said threshold voltage has an amplitude above several hundred mV and a frequency greater than 100 KHz.

14. A method for protecting a device from an interference signal comprising the steps of:
embedding into said device at least one interference protection system at at least one interference signal entrance port of said device;
embedding into said device within said at least one interference protection system,
a first and a second interference signal sensing elements coupled by inputs thereof to said at least one interference signal entrance port, and
a first and a second MOSFET switches connected in series each to the other, each of said MOSFET switches operatively coupled to a respective one of said first and second sensing elements;
coupling a first comparator between an output of said first sensing element and a gate of said first MOSFET switch, and
coupling a second comparator between an output of said second sensing element and a gate of said second MOSFET switch;
setting at said at least one interference signal entrance port a threshold voltage defining a level of an interference signal;
receiving a signal at said at least one interference signal entrance port;
sensing by said at least one embedded interference protection system a level of said received signal;
maintaining, by means of said first and second comparators, said first and second MOSFET switches in ON state thereof when said received signal is below said threshold voltage;
issuing an interference indicative output signal in response to detecting the receipt of said received signal exceeding said threshold voltage;
triggering a respective one of said first and second comparators by said interference indicative output signal to issue a control signal coupled to the gate of a respective one of said first and second MOSFET switches to switch the same OFF; and
cutting off by said at least one embedded interference protection system the propagation of said received signal to an input of said device upon detecting the level of said received signal exceeding said threshold voltage.

15. The method of claim 14, further comprising the steps of:
switching off a respective one of said first and second MOSFET switches in response to said interference indicative output signal to decouple said device from said received signal.

* * * * *